(12) United States Patent
Nentwig (10) Patent No.: US 8,160,519 B2
(45) Date of Patent: Apr. 17, 2012

(54) COMPENSATING FOR VARIATIONS IN THE RESPONSE OF A POWER SUPPLY

(75) Inventor: Markus Nentwig, Helsinki (FI)

(73) Assignee: Nokia Corporation, Espoo (FI)

( * ) Notice: Subject to any disclaimer, the term of this patent is extended or adjusted under 35 U.S.C. 154(b) by 800 days.

(21) Appl. No.: 12/283,100

(22) Filed: Sep. 8, 2008

(65) Prior Publication Data

US 2010/0060358 A1   Mar. 11, 2010

(51) Int. Cl.
*H04B 1/04* (2006.01)

(52) U.S. Cl. ............ 455/127.1; 455/102; 455/126; 455/110; 455/108; 455/127.2; 375/285; 375/298

(58) Field of Classification Search ............ 455/127.1, 455/102, 126, 110, 108, 127.2; 375/285, 375/298
See application file for complete search history.

(56) References Cited

U.S. PATENT DOCUMENTS 7,466,965 B2 * 12/2008 Tanabe .................. 455/102

* cited by examiner

*Primary Examiner* — Sanh Phu
(74) *Attorney, Agent, or Firm* — Harrington & Smith (57) ABSTRACT

Apparatus includes an equalizer having a signal input, a control input and an output; a controllable power supply having a control input and an output, the input of the controllable power supply being coupled to the output of the equalizer; a power amplifier having a main signal input, a power supply input, and an output, the power supply input being coupled to the output of the controllable power supply; and a controller having first and second inputs and an output, the first input being coupled directly or indirectly to the output of the controllable power supply, the second input being coupled to a node upstream of the equalizer, and the output being coupled to the control input of the equalizer; the equalizer being configured to apply equalization to an envelope signal received at its input and to provide a resulting equalized envelope signal at its output, the controllable power supply being configured to provide a power signal at its output based on the equalized envelope signal received at its input, the power amplifier being configured to utilize power received at its power supply input to provide on its output a modulated transmission signal representative of a signal received at the main signal input, and the controller being configured to compare input signals received at its first input to signals received at its second input, and to utilize the results of the comparison to configure the equalizer to correct for variations in the response of the controllable power supply at different frequencies.

30 Claims, 9 Drawing Sheets

COMPENSATING FOR VARIATIONS IN THE RESPONSE OF A POWER SUPPLY

FIELD

This invention relates to compensating for variations in the response of a controllable power supply, for instance an SMPS.

BACKGROUND

It is well known to use switched mode power supplies (SMPSs) in mobile telephones. An SMPS rapidly switches a power transistor between saturation and cutoff with a variable duty cycle whose average leads to the desired output voltage. The resulting rectangular waveform is low-pass filtered with an inductor and capacitor. The main advantage of SMPSs is greater efficiency because the switching transistor dissipates little power in the saturated state and the off state compared to the semiconducting state. Other advantages include smaller size and lighter weight and lower heat generation from the higher efficiency. Disadvantages include complexity, the need to block high amplitude, high frequency energy, and a ripple voltage at the switching frequency and harmonic frequencies thereof.

SUMMARY

A first aspect of the invention provides apparatus comprising:
  an equalizer having a signal input, a control input and an output;
  a controllable power supply having a control input and an output, the input of the controllable power supply being coupled to the output of the equalizer;
  a power amplifier having a main signal input, a power supply input, and an output, the power supply input being coupled to the output of the controllable power supply; and
  a controller having first and second inputs and an output, the first input being coupled directly or indirectly to the output of the controllable power supply, the second input being coupled to a node upstream of the equalizer, and the output being coupled to the control input of the equalizer;
  the equalizer being configured to apply equalisation to an envelope signal received at its input and to provide a resulting equalized envelope signal at its output,
  the controllable power supply being configured to provide a power signal at its output based on the equalized envelope signal received at its input,
  the power amplifier being configured to utilize power received at its power supply input to provide on its output a modulated transmission signal representative of a signal received at the main signal input, and
  the controller being configured to compare input signals received at its first input to signals received at its second input, and to utilize the results of the comparison to configure the equalizer to correct for variations in the response of the controllable power supply at different frequencies.

In the apparatus of the first aspect, the control input of the controllable power supply may be coupled to the output of the equalizer via a digital to analogue converter (DAC).

The apparatus of the first aspect may comprise a source of envelope signals having an input connected to receive an input signal and an output coupled to the signal input of the equalizer. Here, the second input of the controller may be coupled to the output of the source of envelope signals. Alternatively, the source of envelope signals may comprise a Cartesian-to-polar converter having amplitude and phase outputs, and the amplitude output of the Cartesian-to-polar converter may be coupled to the signal input of the equalizer.

The source of envelope signals may comprise an envelope detector. The source of envelope signals may comprise an envelope detector in series with a filter. The source of envelope signals may comprise an envelope detector in series with a non-linear filter In any of these configurations, the second input of the controller may be coupled to the output of the source of envelope signals.

The apparatus of the first aspect may comprise a predistortion arrangement arranged to receive the input signal at a first input and to receive the envelope signal at a second input and to provide therefrom a predistorted signal on an output, the output of the predistortion arrangement being coupled to the main signal input of the power amplifier.

The apparatus of the first aspect may comprise a delay element connected upstream of the main signal input of the power amplifier.

The apparatus of the first aspect may comprise a modulator connected upstream of the main signal input of the power amplifier. Here, the modulator may be a phase modulator. Alternatively, the modulator may be a linear modulator.

In the apparatus of the first aspect, the first input of the controller may be coupled to the output of the controllable power supply via an analogue to digital converter (ADC).

In the apparatus of the first aspect, the first input of the controller may be coupled to the output of the power amplifier.

In the apparatus of the first aspect, the first input of the controller may be coupled to the output of the power amplifier via a power sensor.

In the apparatus of the first aspect, the first input of the controller may be coupled to the output of the controllable power supply via a power sensor.

In the apparatus of the first aspect, the equalizer may be a digital filter.

In the apparatus of the first aspect, the equalizer may be a finite impulse response filter.

The apparatus of the first aspect may comprise a test tone generator having an output coupled to the signal input of the equalizer, the test tone generator being configured to generate test tone signals at a frequency and provide them to the signal input of the equalizer, and then to generate test tone signals at a different frequency and provide them to the signal input of the equalizer.

In the apparatus of the first aspect, the controller may be configured to configure the equalizer to correct for variations in the response of the controllable power supply at different frequencies by being configured to approximate the inverse frequency response of the controllable power supply across a range of frequencies of interest.

A second aspect of the invention provides apparatus comprising:
  equalizer means having a signal input, a control input and an output;
  controllable power supply means having a control input and an output, the input of the controllable power supply means being coupled to the output of the equalizer means;

power amplifier means having a main signal input, a power supply input, and an output, the power supply input being coupled to the output of the controllable power supply means; and control means having first and second inputs and an output, the first input being coupled directly or indirectly to the output of the controllable power supply means, the second input being coupled to a node upstream of the equalizer means, and the output being coupled to the control input of the equalizer means;

the equalizer means being configured to apply equalisation to an envelope signal received at its input and to provide a resulting equalized envelope signal at its output, the controllable power supply means being configured to provide a power signal at its output based on the equalized envelope signal received at its input, the power amplifier means being configured to utilize power received at its power supply input to provide on its output a modulated transmission signal representative of a signal received at the main signal input, and the control means being configured to compare input signals received at its first input to signals received at its second input, and to utilize the results of the comparison to configure the equalizer means to correct for variations in the response of the controllable power supply at different frequencies.

Apparatus according to either the first or the second aspects may form part of a battery-powered communications device.

A third aspect of the invention provides a method comprising:

generating an envelope signal from an input signal;
using an equalizer to filter the envelope signal;
using the filtered envelope signal to control a controllable power supply to provide power to a power amplifier;
comparing an output of the controllable power supply to signals at a node upstream of the equalizer; and
configuring the equalizer to correct for variations in the response of the controllable power supply at different frequencies.

The method may comprise using an input signal and the envelope signal to provide a predistorted signal, and providing the predistorted signal to a main signal input of the power amplifier.

The method may comprise using a delay element to delay signals provided to a main signal input of the power amplifier.

Comparing the output of the controllable power supply to signals at a node upstream of the equalizer may comprise sensing power at an output of the power amplifier. Alternatively, comparing the output of the controllable power supply to signals at a node upstream of the equalizer may comprise sensing signals at an output of the controllable power supply.

The method may comprise generating test tone signals at a frequency and providing them to the signal input of the equalizer, and then generating test tone signals at a different frequency and providing them to the signal input of the equalizer.

The control means may be configured to configure the equalizer means to correct for variations in the response of the controllable power supply means at different frequencies by being configured to approximate the inverse frequency response of the controllable power supply means across a range of frequencies of interest. Unless otherwise stated, the features described as being associated with one aspect may be used with any combination of other features from that aspect.

BRIEF DESCRIPTION OF THE DRAWINGS

Embodiments of the present invention will now be described, by way of example only, with reference to the accompanying drawings of which.

DETAILED DESCRIPTION OF THE PREFERRED EMBODIMENTS

Figure 1:
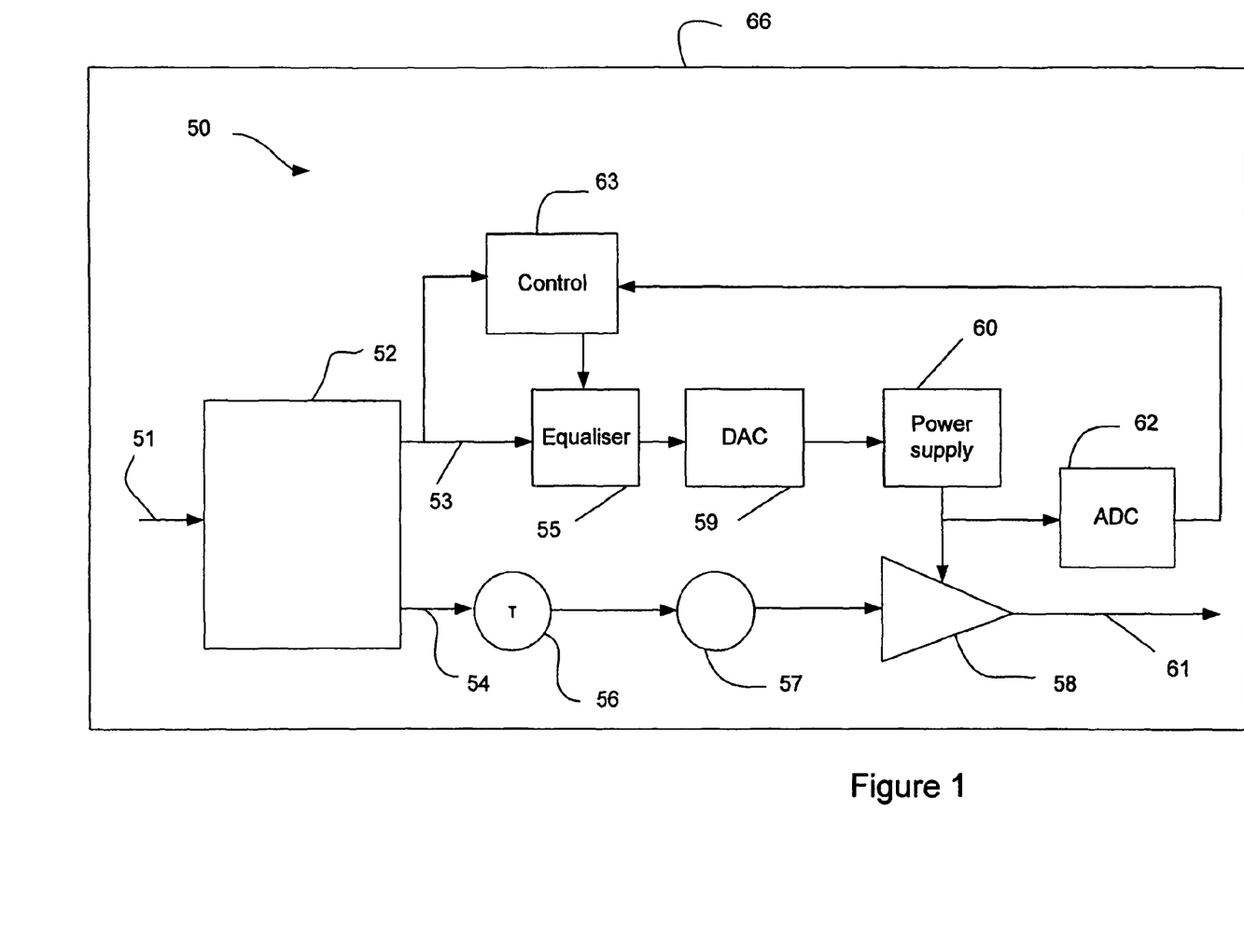
FIG. 1 is a circuit diagram of a first embodiment of a transmitter in accordance with aspects of the present invention.

Referring firstly to FIG. 1, a transmitter 50 is shown in highly simplified form. The transmitter 50 incorporates envelope tracking. The transmitter 50 is provided as part of a transmitter device 66, which may be a battery-powered portable communications device. The device 66 may be a mobile phone, PDA, modem device or the like.

A baseband signal 51 is received at the sole input of a signal modifier 52. The baseband signal here is a complex signal having I and Q components. The signal modifier 52 provides two outputs, namely an envelope signal on an envelope output 53 and a modulation signal output on a modulation signal output 54. The natures of these signals will become apparent from the discussion below.

The signal on the modulation output 54 is delayed using a delay element 56. The resulting delayed modulation signal is upconverted to radio frequency using a linear modulator 57. For example, linear modulator 57 may use direct conversion, generating the radio frequency signal by adding a radio frequency sine wave that is multiplied with the real part of the delayed modulation signal, and a radio frequency cosine wave that is multiplied with the imaginary part of the delayed modulation signal. Other types of linear modulators exist, for example based on the superheterodyne principle that employs one or more intermediate frequencies.

The resulting radio frequency signal is applied to a signal input of a power amplifier 58.

The envelope signal provided at the output 53 of the signal modifier 52 has a value that varies with varying amplitude of the input signal. The instantaneous value of the signal provided at the output 53 of the signal modifier 52 is dependent on the amplitude of the envelope of the input signal 51.

The envelope signal provided at the envelope output 53 is applied to a signal input of an equalizer 55. The equalizer 55 could be termed a correction filter or equalisation filter. The equalizer 55 may for instance be a digital FIR filter. The equalizer 55 has a frequency response that is dependent on the signal received at a control input. As such, the signal provided at an output of the equalizer 55 has a spectrum that is to some extent different to the signal provided at the input of the equalizer 55, although it is very closely related.

An output of the equalizer 55 is applied to an input of a digital to analogue converter (DAC) 59, which converts the digital signal provided by the equalizer 55 into an analogue signal. The resulting analogue signal is then provided at an output of the DAC 59.

The output of the DAC 59 is connected to a control input of a power supply 60. The power supply 60 generates a power out signal at an output. The power out signal has a voltage that is dependent on the analogue signal received from the DAC 59. The power out signal is applied to a supply voltage input of the power amplifier 58.

The power supply 60 may take any suitable form. The power supply 60 may be a switched mode power supply (SMPS). Alternatively, the power supply 60 may be a linear regulator, or a combination of a linear regulator and an SMPS, for instance connected in series. A linear regulator may be formed by a transistor in series with the voltage supply. In this case, the transistor is configured to cause a variable voltage drop so that the supply voltage provided to the power amplifier 58 has the required level. A linear regulator can achieve a higher bandwidth than an SMPS, but is less efficient than a SMPS since the voltage drop in combination with the current through the power amplifier 58 causes power dissipation that does not result from a corresponding pure SMPS system. In the following the power supply 60 is said to be an SMPS.

The power amplifier 58 operates to combine the signal provided by the linear modulator 57 with the power out signal provided by the SMPS 60. The power amplifier provides the resulting radio frequency signal at an output 61. The signal at the output 61 carries the modulation information present in the input signal 51.

The SMPS 60, as a result of being provided with a version of the envelope signal, provides a supply voltage at an optimum level. The level is an optimum level in that is sufficient to allow the power amplifier 58 to operate without distortion. If the supply voltage provided by the SMPS 60 is lower than the optimum level, distortion can occur, negatively impacting the performance of the transmitter 50. If the supply voltage provided by the SMPS 60 is higher than the optimum level, battery drain and heat generation are higher than is necessary. Operating the power amplifier 58 with a supply voltage higher than the optimum level thus results in reduced times between battery re-charges, and can more easily result in overheating of the device 66.

Because the signal provided to the input of the power amplifier 58 contains amplitude information in addition to phase information, the transmitter 50 is able to generate very small instantaneous output powers. In particular, this is achieved by applying a low amplitude modulation signal to the input of the power amplifier 58.

The power out signal provided by the SMPS 60 is sampled by an analogue-to-digital converter (ADC) 62 and input to a first input of a control block 63. The envelope signal at the output 53 of the signal modifier 52 is provided to a second input of the control block 63. An output of the control block 63 is connected to a control input of the equalizer 55. The control block 63 may take any suitable form, for instance a collection of logic gates or a microcontroller operating under software control. The function of the control block 63 is considerably more important than its structure.

The control block 63 operates to control the equalizer 55 to alter its frequency response. The control block 63 provides a control signal to the equalizer 55 that results in the equalizer 55 having a frequency response that minimizes the least-squares difference between the signal at the output 53 of the signal modifier 52 and the power out signal provided by the SMPS 60. Here the word 'minimize' is used to denote minimize or substantially minimize. In effect, the control block 63 configures the equalizer 55 to approximate the inverse frequency response of the SMPS 60. To achieve this, the control block 63 implements a mean squared error (MSE) equalization method, for example a method described by Proakis D. in "Digital Communications", ISBN 007232593. Numerous other suitable methods are known in the art.

It will be appreciated that the control block 63 configures the equalizer 55 to approximate the inverse frequency response of the SMPS 60 only over a bandwidth of interest. Outside of the bandwidth of interest, the control block 63 may effect less configuration of the equalizer 55 to approximate the inverse frequency response of the SMPS 60, or it may not configure the equalizer 55 to approximate the inverse frequency response of the SMPS 60 at all. The reasons for this will now be explained, along with some more detail of the implementation.

The SMPS 60 may exhibit lowpass characteristics. The equalizer 55 may process an envelope signal over a significantly wider bandwidth than the lowpass bandwidth of SMPS 60. For example, the bandwidth of the equalizer may be limited by the Nyquist bandwidth of the DAC 59. Compensating the frequency response of the SMPS 60 over the whole bandwidth provided by the DAC 59 may be impractical or impossible, because the required signal amplitude at the output of DAC 59 may become prohibitively high (at frequencies where the response of the SMPS 60 is poor, a higher amplitude control signal is needed to compensate).

Limited by implementation constraints, such as for example a finite number of coefficients in equalizer 55, the resulting frequency response configured to equalizer 55 may approximate the SMPS frequency response with varying degrees of accuracy at different frequencies. For example, the approximation may be very accurate at frequencies where the spectral power density of the desired output signal from the SMPS is relatively high, and the approximation may be less accurate at frequencies where the spectral power density of the signal is relatively low. At some frequencies, for example above a predetermined upper corner frequency, the equalizer 55 may be configured to not approximate an inverse of a frequency response at all. Therefore, the frequency response of equalizer 55 may be considered an approximation to the inverse of the frequency response of SMPS 60, but to a limited extent. The limited extent in this instance is a limited bandwidth. The bandwidth is at the lower end of the range of the bandwidth of the equalizer 55.

The delay element 56 is a fixed delay element. The delay element 56 introduces a delay that matches the delay in the other branch, that results primarily from the equalizer 55. The inclusion of the delay element 56 reduces signal distortion.

Details of the signal modifier 52 will now be described. In the following, like reference numerals denote like elements.

Figure 2A:
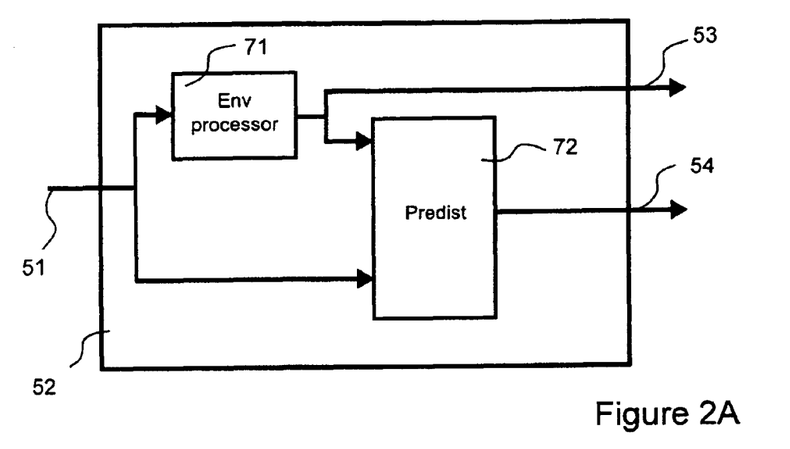
FIGS. 2A to 2E are schematic diagrams of details of a signal modifier forming part of the FIG. 1 transmitter.

In FIG. 2A, the signal modifier 52 provides the received baseband signal 51 to an envelope processor 71 and to a first input of a predistortion block 72, both of which form part of the signal modifier 52. The envelope processor 71 generates an envelope signal that is real-valued (i.e. it is not complex-valued). The envelope signal is provided to a second input of the predistortion block 72, and at the envelope output 53 of the signal modifier 52. The predistortion block 72 provides a modulation signal that is complex-valued at the modulation signal output 54 of the signal modifier 52.

The envelope processor 71 may take any suitable form. One suitable form is described below with reference to FIGS. 2B, 2C and 2D. The envelope signal is generated such that at any point in time the supply voltage provided to the power amplifier 58 equals or exceeds the minimum supply voltage required to generate the desired instantaneous output power.

The predistortion block 72 corrects the known variations in the complex gain (i.e. both amplitude and phase) of the power amplifier 58. The predistortion block 72 compensates for amplitude-to-amplitude modulation (AM-AM) and amplitude-to-phase modulation (AM-PM) effects resulting from the gain of the power amplifier 58 varying in amplitude and in phase with both the magnitude of the input signal and the voltage supplied to the amplifier. Without the predistortion block 72, AM-AM and AM-PM would result in undesirable distortion products at the output of the power amplifier 58.

Figure 2B:
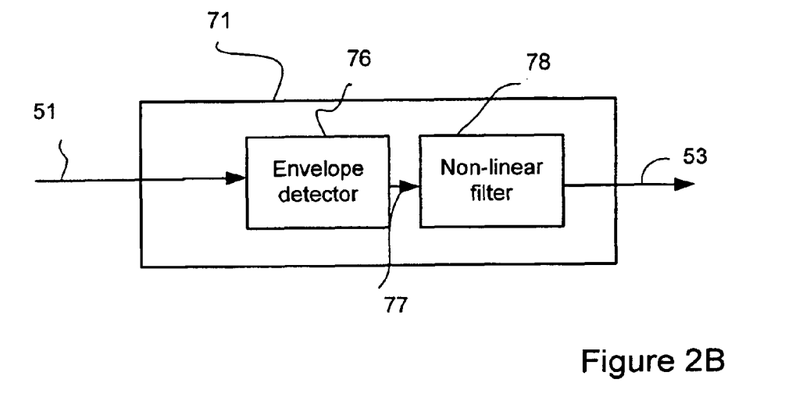

In FIG. 2B, the envelope processor 71 is shown to provide the baseband signal 51 to an envelope detector 76. The envelope detector 76 generates an envelope signal at its output 77 that is real-valued (i.e. it is not complex-valued). This signal is filtered by a non-linear filter 78, such as the filter disclosed in US 2007/0258602. The filtered envelope signal is provided at the envelope output 53 of the signal modifier 52.

Figure 2C:
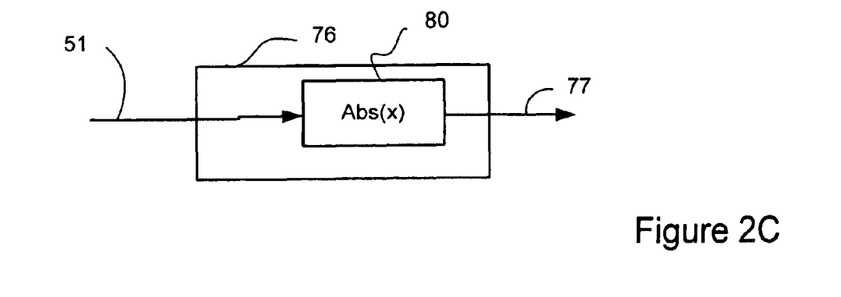

In FIG. 2C, the envelope detector 76 includes an envelope detection function 80 that determines the absolute value of the complex-valued input signal 51 and provides the resulting envelope signal at the output of the envelope detector 77.

Figure 2D:
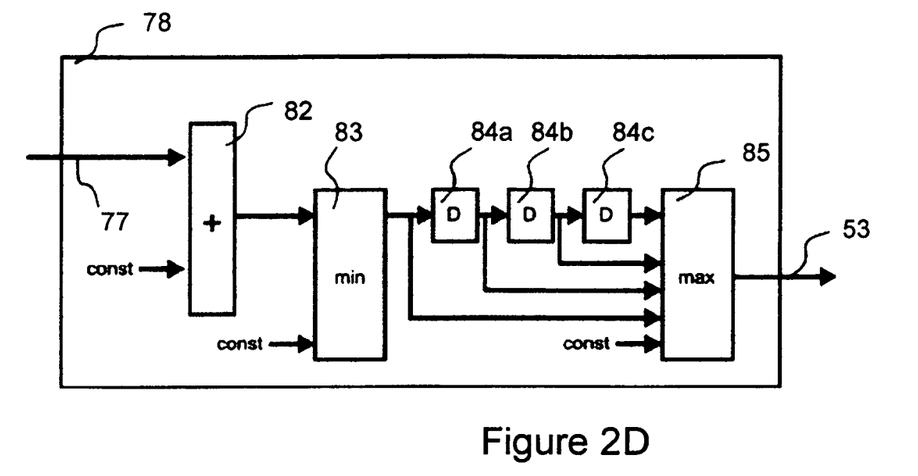

In FIG. 2D, the nonlinear filter 78 is shown in some detail. An adder 82 adds a predetermined offset to the instantaneous value of the input signal received at the input, which is provided by the output of the envelope detector 77. A minimum function 83 limits the magnitude of the resulting signal to a predetermined limit. Several time-delayed versions of the resulting signal are provided by a delay chain comprising series connected delay elements 84a, 84b, 84c. A maximum function 85 determines the highest value of the signals provided by the minimum function 83, the delay elements 84a, 84b, 84c and a predetermined constant minimum value and provides that value at the envelope output 53. The resulting signal is an envelope signal.

Although the variable supply voltage provided by the SMPS 60 to the power amplifier 58 modulates the gain of the power amplifier 58, the amplitude of the signal at the output of the power amplifier 58 is determined primarily by the modulation signal provided at the output 54 of the signal modifier 52.

By virtue of the construction and operation of the signal modifier 52, for instance as exemplified in FIGS. 2A, 2B, 2C and 2D, the envelope signal provided at the envelope output 53 never falls below the magnitude of the transmission signal. This allows the power amplifier 58 to produce the desired instantaneous output power at any point in time. Furthermore, the envelope signal never falls below a predetermined minimum, thereby maintaining a minimum level of supply voltage across the power amplifier 58 at all times and preventing undesirable distortion when the transmitted instantaneous power is low.

The predistortion block 72 shown in FIG. 2A may take any suitable form.

Figure 2E:
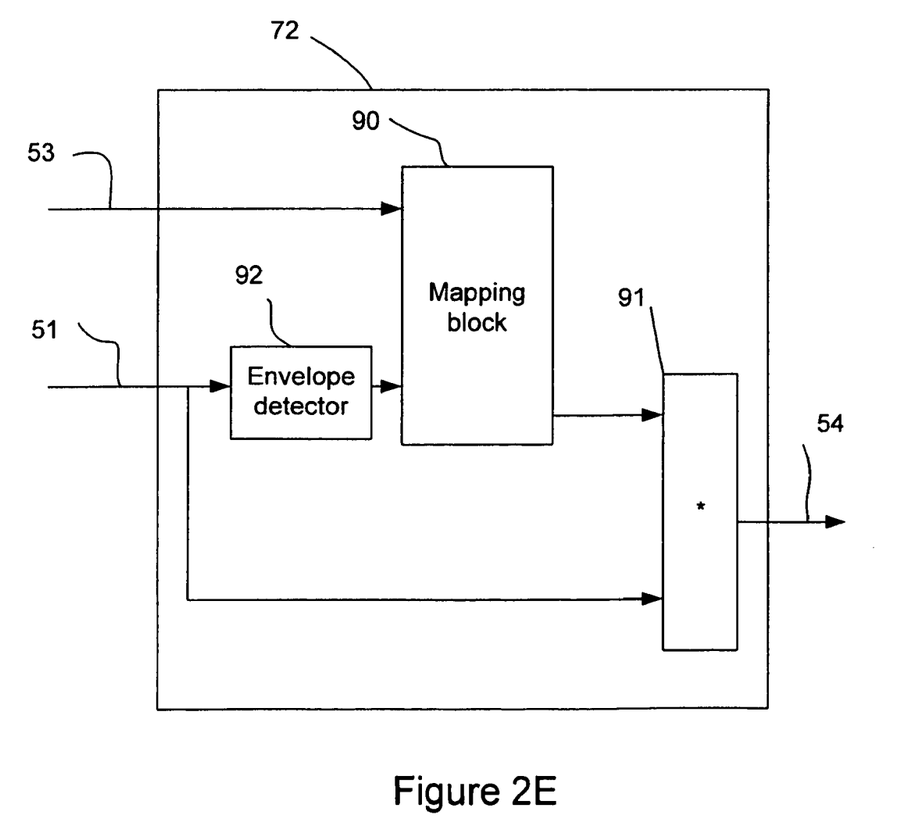

One suitable form will now be described with reference to FIG. 2E. An envelope detector 92 receives the baseband input signal 51, and provides a corresponding magnitude signal to a first input of a mapping block 90. A second input of the mapping block 90 is connected to receive the signal provided by the output 53 of the envelope processor 71. The mapping block 90 determines a complex correction factor that, when multiplied with the input signal to the power amplifier 58, compensates unwanted AM-AM and AM-PM distortion introduced by the power amplifier. The output of the mapping block 90 is multiplied with the baseband input signal 51 by a multiplier 91, and the complex-valued result is provided at the output 54.

An effect of the predistortion block 72 is to compensate the known nonlinearity of die power amplifier 58 with regard to variations in supply voltage and magnitude of the RF input signal (i.e. the signal provided by the linear modulator 57). The complex-valued output signal from the predistortion block 72 is then delayed by delay 56, upconverted to radio frequency in the linear modulator 57 and provided to the radio frequency input of the power amplifier 58.

The inclusion of the predistortion block 72 considerably improves performance, and allows strict cellular requirements more easily to be met.

Figure 3:
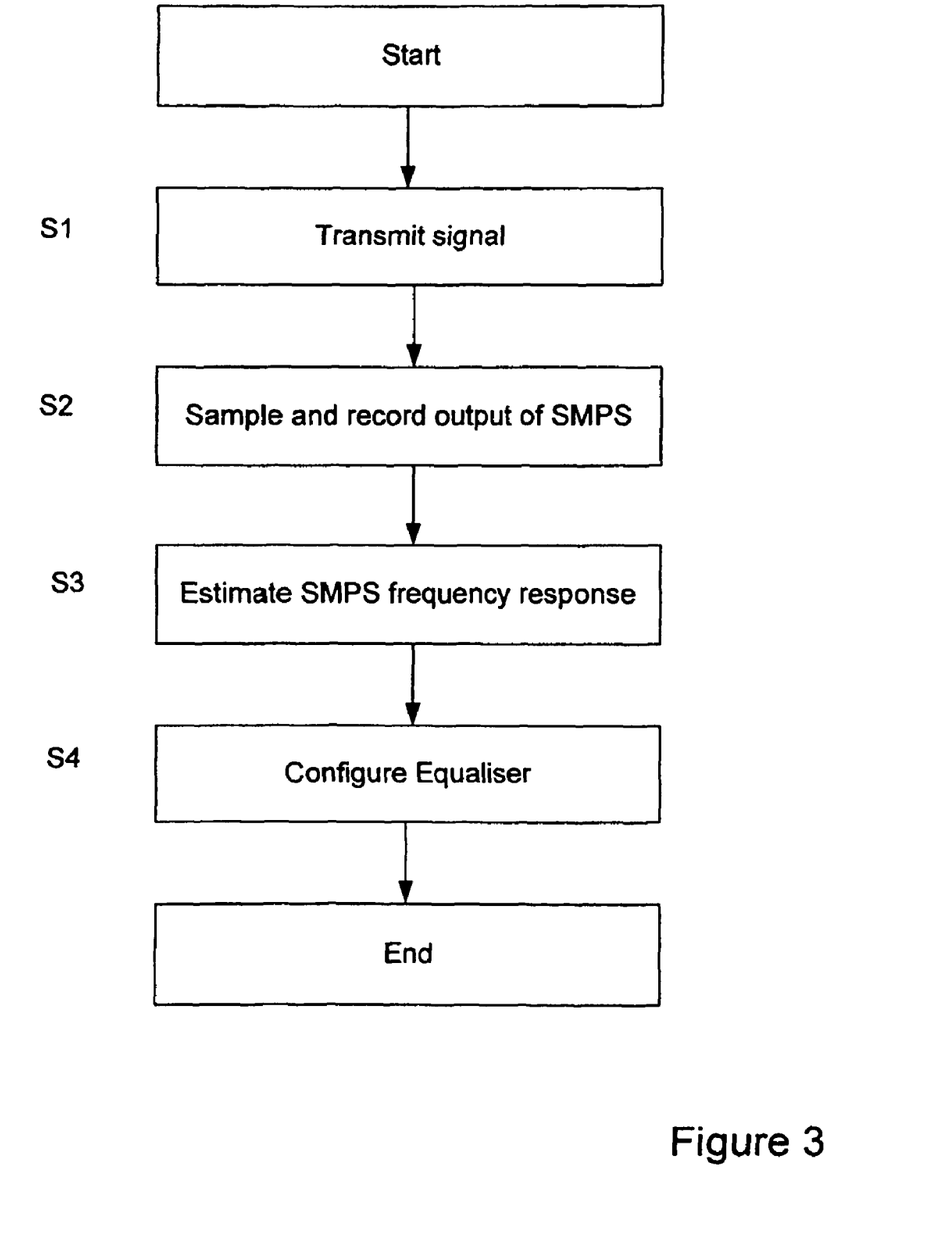
FIG. 3 is a flow chart showing a method of operation of the FIG. 1 transmitter.

The method of operation of the FIG. 1 circuit will now be described briefly with reference to FIG. 3. Here, a signal is transmitted at step S1, after operation starts. The signal has a large bandwidth, so includes signal components at a number of frequencies across a range of frequencies. At step S2, the analog-to-digital converter 62 samples and records the output of the SMPS 60. At step S3, the control block 63 determines a set of equalizer coefficients, based on a comparison between the signal output of the SMPS with the signal output by the signal modifier 52. At step S4 the equalizer 55 is configured using the equalizer coefficients, approximating the inverse of the SMPS frequency response. The operation then ends.

The effect of this is to compensate for variations in the response of the SMPS 60 at different frequencies within the bandwidth of the desired output signal from SMPS 60.

In summary, the transmitter 50 observes the output signal of the SMPS subsystem, compares the observed output signal to the known SMPS input signal and estimates the frequency response of the SMPS 60 over a certain bandwidth. It then configures a correction filter (the equalizer 55) to approximate the inverse frequency response over that bandwidth, therefore linearizing the frequency response of the amplitude path within that bandwidth. An additional advantage achieved by the equalisation of the frequency response of the power amplifier 58 is that the actual supply voltage provided to the power amplifier 58 can be predicted more accurately by the predistortion block 72.

The embodiment described above is of particular application to radio systems having a variable power envelope, for instance OFDM (orthogonal frequency division multiplexed) signals. As is well known, such systems allow higher spectral efficiency than do radio systems operating on fixed envelope signals.

Figure 4:
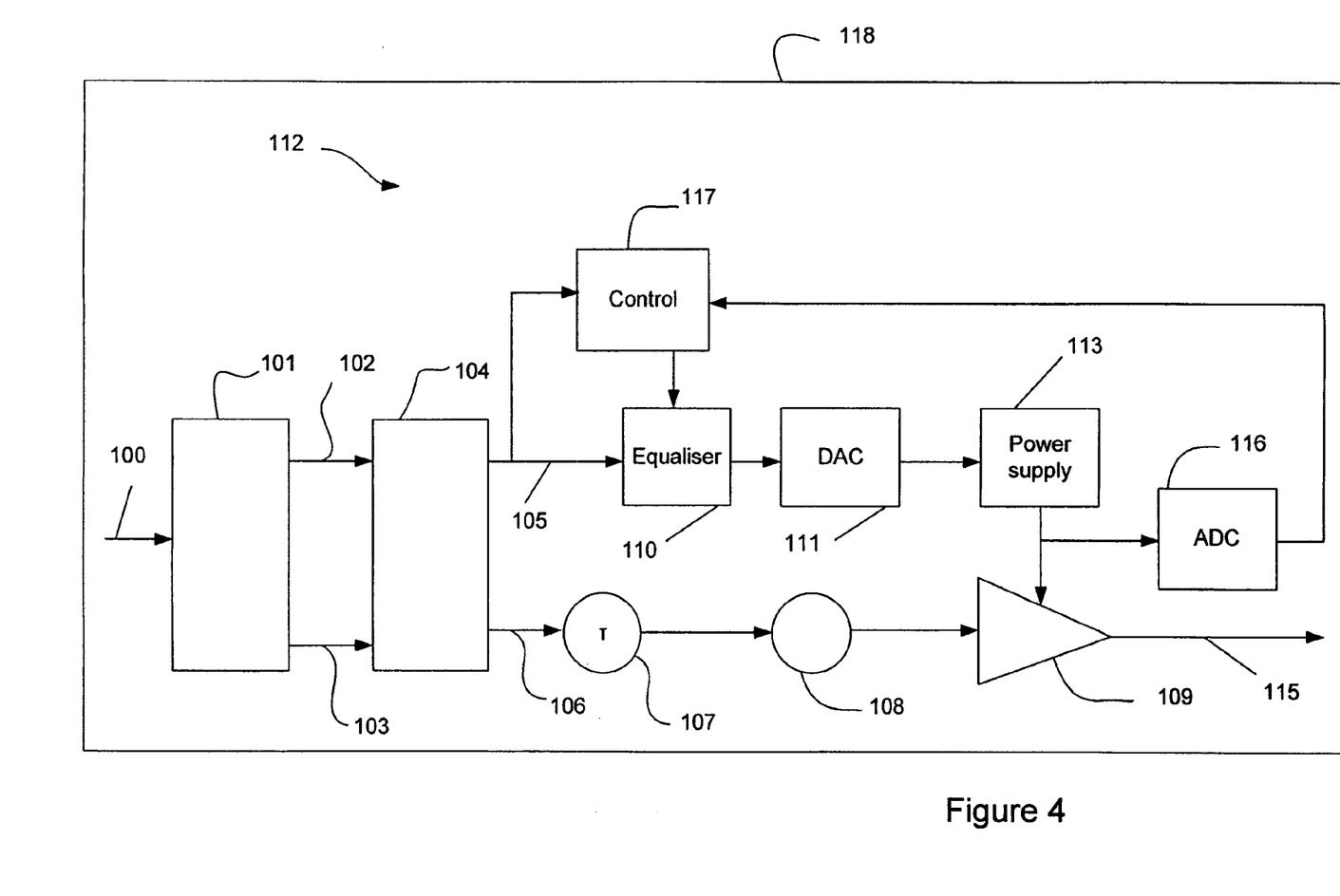
FIG. 4 is a circuit diagram of a second embodiment of a polar transmitter in accordance with aspects of the present invention.

Referring next to FIG. 4, a polar transmitter 112 is shown in highly simplified form. The transmitter 112 implements envelope elimination and restoration (EER), also known as "Kahn-technique". The scheme applies in a similar manner to envelope tracking, where part of the amplitude information is fed into the PA via the radio frequency input, here referred to as "phase path". The polar transmitter 112 can be referred to as an EER transmitter.

A baseband signal 100 is received at the sole input of a Cartesian-to-polar converter 101. The baseband signal here is a complex signal having I and Q components. The Cartesian-to-polar converter 101 provides two outputs, namely an amplitude component output on a line 102 and a phase component output on a line 103. A predistortion block 104 receives both the outputs of the Cartesian-to-polar converter 101. The predistortion block 104 corrects the known amplitude-dependent characteristics of power amplifier 109. Those are known as amplitude-to-amplitude modulation (AM-AM) and amplitude-to-phase modulation (AM-PM) effects resulting from the gain of the power amplifier 109 varying in magnitude and phase with both the magnitude of the input signal and the level of the supply voltage. Without the predistortion block 104, AM-AM and AM-PM would result in undesirable distortion products at the output of the power amplifier 109. The predistortion block 104 provides a predistorted amplitude signal on a first output 105 and a predistorted phase signal on a second output 106.

The predistorted phase signal 106 is delayed using a delay element 107. The resulting delayed predistorted phase signal is upconverted to radio frequency using a phase modulator 108, for example a PLL (phase locked loop)-based synthesizer. The resulting constant-amplitude radio frequency signal is applied to the signal input of the power amplifier 109. The signal applied to the signal input of the power amplifier 109 has a constant amplitude because it is derived from the phase component of the input complex signal and as such varies between maximum and minimum values within a time period set by the frequency of the signal. The difference between the maximum and minimum values is the amplitude of the signal.

The predistorted amplitude component provided at the output 105 of the predistortion block 104 has a value that varies with varying amplitude of the input signal 100. The instantaneous value of the signal provided at the output 105 of the predistortion block 104 is wholly representative of the amplitude of the envelope of the input signal 100. The predistorted amplitude component provided at the output 105 of the predistortion block 104 can be termed an envelope signal.

The predistorted amplitude component provided at the output 105 is applied to a signal input of an equalizer 110. The equalizer 110 could be termed a correction filter or equalisation filter. The equalizer 110 has a frequency response that is dependent on the signal received at a control input. The equalizer 110 may for instance be a digital FIR filter. As such, the signal provided at an output of the equalizer 110 has a spectrum that is to some extent different to the signal provided at the input of the equalizer 110, although it is very closely related. An output of the equalizer 110 is applied to an input of a digital to analogue converter (DAC) 111, which converts the digital signal provided by the equalizer 110 into an analogue signal that is then provided at an output of the DAC 111.

The output of the DAC 111 is applied to a control input of a power supply 113. The power supply 113 generates a power out signal at an output. The power out signal has a voltage that is dependent on the analogue signal received from the DAC 111. The power out signal is applied to a supply voltage input of the power amplifier 109.

The power supply 113 may take any suitable form. The power supply 113 may be a switched mode power supply (SMPS). Alternatively, the power supply 113 may be a linear regulator, or a combination of a linear regulator and an SMPS, for instance connected in series. A linear regulator may be formed by a transistor in series with the voltage supply. In this case, the transistor is configured to cause a variable voltage drop so that the supply voltage provided to the power amplifier 109 has the required level. A linear regulator can achieve a higher bandwidth than an SMPS, but is less efficient than a SMPS since the voltage drop in combination with the current through the power amplifier 109 causes power dissipation that does not result from a corresponding pure SMPS system. In the following the power supply 113 is said to be an SMPS.

The power amplifier 109 operates to recombine the phase-modulated signal provided by the phase modulator 108 with the power out signal provided by the SMPS 113. The power amplifier provides the resulting radio frequency signal at an output 115. The signal at the output 115 carries the modulation information present in the input signal 100. The SMPS 113, as a result of being provided with a version of the envelope signal, provides a supply voltage at a level that gives rise to a signal at the output of the power amplifier 109 that has the correct amplitude, with regard to the input signal 100.

The power out signal provided by the SMPS 113 is sampled by an analogue to digital converter (ADC) 116 and input to a first input of a control block 117. The predistorted amplitude component at the output 105 of the predistortion block 104 is provided to a second input of the control block 117. The output of the control block 117 is connected to the control input of the equalizer 110. The control block 117 may take any suitable form, for instance a collection of logic gates or a microcontroller operating under software control. The function of the control block 117 is considerably more important that its structure.

The control block 117 operates to control the equalizer 110 to alter its frequency response. The control block 117 provides a control signal to the equalizer 110 that results in the equalizer having a frequency response that minimizes the least-squares difference between the signal at the output 105 of the predistortion block 104 and the power out signal provided by the SMPS 113. Here the word 'minimize' is used to denote minimize or substantially minimize. In effect, the control block 117 configures the equalizer 110 to approximate the inverse frequency response of the SMPS 113. To achieve this, the control block 117 implements a MSE equalization method, for example a method described by Proakis D. in "Digital Communications", ISBN 0072321113. Numerous other suitable methods are known in the art. As discussed above, the frequency response is determined and corrected only in respect of a bandwidth of interest.

Delay element 107 introduces an amount of delay that matches the signal delays in the two branches of the transmitter. Signal delay in the other branch results primarily from the equalizer 110. This reduces signal distortion.

The polar transmitter 112 is provided as part of a transmitter device 118, which may be a battery-powered portable communications device. The device 118 may be a mobile phone, PDA, modem device or the like.

Figure 5:
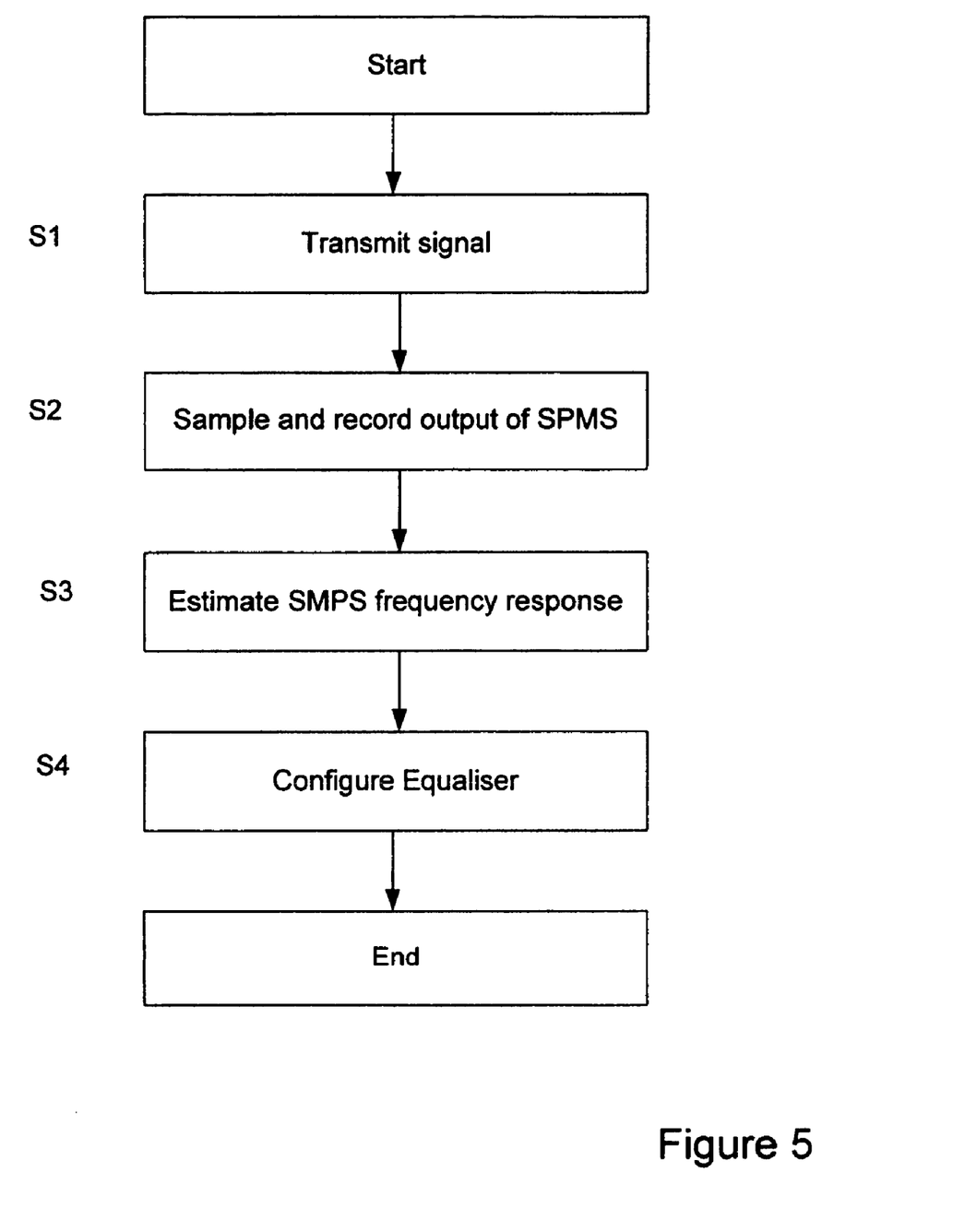
FIG. 5 is a flow chart showing a method of operation of the FIG. 4 transmitter in accordance with aspects of the present invention.

The method of operation of the FIG. 4, circuit will now be described briefly with reference to FIG. 5. Here, a signal is transmitted at step S1, after operation start. At step S2, the control block 117 samples and records the output of the SMPS 113. At step S3, the control block 117 determines a set of equalizer coefficients, based on a comparison between the signal output by the SMPS to the signal output by the predistortion block 104. At step S4 the equalizer 110 is configured using the set of equalizer coefficients. The operation then ends.

The effect of this is to compensate for variations in the response of the SMPS 113 at different frequencies. This is advantageous since it provides suitably high performance levels from a polar transmitter architecture when high bandwidth input signals are desired to be transmitted. In prior art polar transmitters, the design of the SMPS was required to accommodate the requirement for high bandwidth input signals, for instance by providing the SMPS with a flat frequency response. Polar transmitters have the advantage of high efficiency, compared to other transmitter types. As such, the fact that the embodied apparatus allows an SMPS not having a flat frequency response to be used in polar transmitter arrangements is very significant.

The FIG. 4 embodiment involves a relatively high degree of signal processing (in the control block 117). However, calibration can take place during normal operation of the polar transmitter.

Delay element 107 delays the signal by an amount that results in equal delay between the envelope signal reaching the power amplifier 109 through the power supply 113, and the radio frequency signal entering the power amplifier 109 via the modulator 108, preventing unwanted distortion caused by a time difference between envelope and radio frequency signals.

In summary, the polar transmitter 112 observes the output signal of the SMPS subsystem, compares the observed output signal to the known SMPS input signal and configures a correction filter (the equalizer 110) to approximate the inverse frequency response of the SMPS, therefore linearizing the frequency response of the amplitude path. An advantage achieved by the equalization of the frequency response of the power amplifier 109 is that the actual supply voltage provided to the power amplifier 109 can be predicted more accurately by the predistortion block 104. As discussed above, the frequency response is determined and corrected only in respect of a bandwidth of interest.

This embodiment can be described as an ADC based implementation. Another embodiment can be described as a power sensor based implementation.

Figure 6:
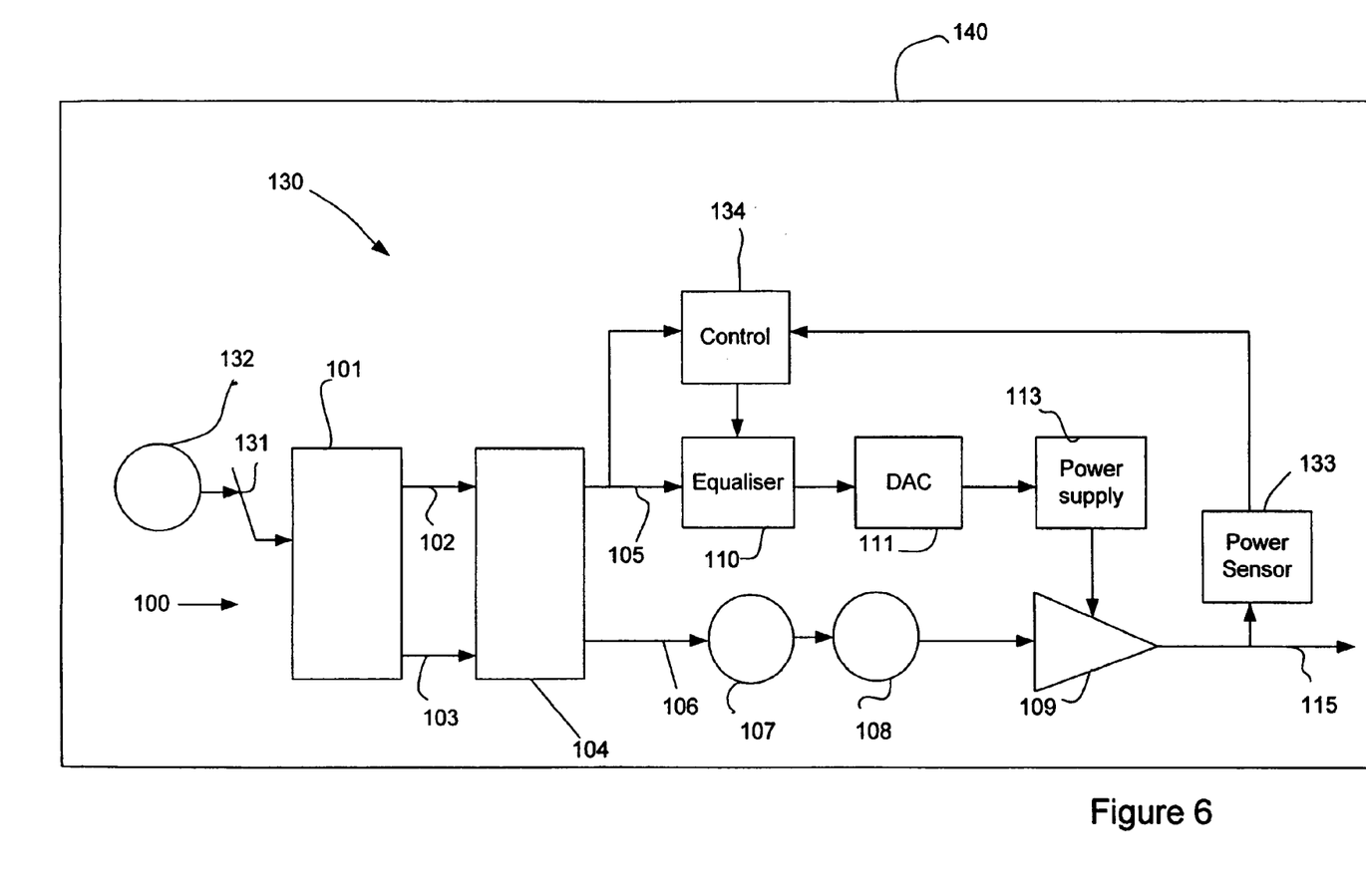
FIG. 6 is a circuit diagram of a third embodiment of a polar transmitter in accordance with aspects of the present invention.

Referring now to FIG. 6, a polar transmitter 130 is shown in highly simplified form. Reference numerals are retained from FIG. 4 for like elements. The transmitter 130 implements envelope elimination and restoration. The scheme applies in a similar manner to envelope tracking, where part of the amplitude information is fed into the PA via the radio frequency input, here referred to as "phase path".

A switch 131 connects either the baseband input signal 100 during normal operation, or a test tone 131 from a test tone generator 132 to the sole input of the Cartesian-to-polar converter 101. This is described in more detail below.

The baseband signal here is a complex signal having I and Q components. The Cartesian-to-polar converter 101 provides two outputs, namely an amplitude component output on a line 102 and a phase component output on a line 103. A predistortion block 104 receives both the outputs of the Cartesian-to-polar converter 101. The predistortion block 104 corrects the known amplitude-dependent characteristics of power amplifier 109 by providing a predistorted amplitude signal on a first output 105 and a predistorted phase signal on a second output 106. Those are known as amplitude-to-amplitude modulation (AM-AM) and amplitude-to-phase modulation (AM-PM) effects resulting from the gain of the power amplifier 109 varying in amplitude and in phase with both the magnitude of the input signal and the level of the supply voltage provided to the power amplifier. Without the predistortion block 104, AM-AM and AM-PM would result in undesirable distortion products at the output of the power amplifier 109.

The predistorted phase signal 106 is delayed using a delay element 107. The resulting delayed predistorted phase signal is upconverted to radio frequency using a phase modulator 108, for example a PLL (phase locked loop)-based synthesizer. The resulting constant-amplitude radio frequency signal is applied to the signal input of the power-amplifier 109. The signal applied to the signal input of the power amplifier 109 has a constant amplitude because it is derived from the phase component of the input complex signal and as such varies between 0 and a maximum value within a time period set by the frequency of the signal.

The predistorted amplitude component provided at the output 105 of the predistortion block 104 has a value that varies with varying amplitude of the input signal 100. The signal provided at the output 105 of the predistortion block 104 is wholly representative of the envelope of the input signal 100. The predistorted amplitude component provided at the output 105 of the predistortion block 104 can be termed an envelope signal.

The predistorted amplitude component provided at the output 105 is applied to a signal input of an equalizer 110. The equalizer 110 could be termed a correction filter. The equalizer 110 has a frequency response that is dependent on the signal received at a control input. The equalizer 110 may for instance be a digital FIR filter. As such, the signal provided at an output of the equalizer 110 has a spectrum that is to some extent different to the signal provided at the input of the equalizer 110, although it is very closely related. An output of the equalizer 110 is applied to an input of a digital to analogue converter (DAC) 111, which converts the digital signal provided by the equalizer 110 into an analogue signal that is then provided at an output of the DAC 111.

The output of the DAC 111 is applied to a control input of a power supply 113. The power supply 113 generates a power out signal at an output. The power out signal has a voltage that is dependent on the analogue signal received from the DAC 111. The power out signal is applied to a supply voltage input of the power amplifier 109.

The power supply 113 may take any suitable form. The power supply 113 may be a switched mode power supply (SMPS). Alternatively, the power supply 113 may be a linear regulator, or a combination of a linear regulator and an SMPS, for instance connected in series. A linear regulator may be formed by a transistor in series with the voltage supply. In this case, the transistor is configured to cause a variable voltage drop so that the supply voltage provided to the power amplifier 109 has the required level. A linear regulator can achieve a higher bandwidth than an SMPS, but is less efficient than a SMPS since the voltage drop in combination with the current through the power amplifier 109 causes power dissipation that does not result from a corresponding pure SMPS system. In the following the power supply 113 is said to be an SMPS.

The power amplifier 109 operates to recombine the phase-modulated signal provided by the phase modulator 108 with the power out signal provided by the SMPS 113. The power amplifier provides the resulting radio frequency signal at an output 115. The signal at the output 115 carries the modulation information present in the input signal 100. The SMPS 113, as a result of being provided with a version of the envelope signal, provides a supply voltage at a level that gives rise to a signal at the output of the power amplifier 109 that has the correct amplitude, with regard to the baseband input signal.

The output signal of the power amplifier 109 is provided to an input of a power sensor 133. An output of the power sensor 133 is provided to a first input of a control block 134. The amplitude output of the predistortion block 104 is provided to a second input of the control block 134. The output of the control block 134 is connected to the control input of the equalizer 110. The control block 134 may take any suitable form, for instance a collection of logic gates or a microcontroller operating under software control. The function of the control block 134 is considerably more important that its structure.

The control block 134 operates to control the equalizer 110 to alter its frequency response. The control block 134 provides a control signal to the equalizer 110 that results in the equalizer having a frequency response that minimizes the least-squares difference between the signal at the output 105 of the predistortion block 104 and the power out signal provided by the SMPS 113. Here the word 'minimize' is used to denote minimize or substantially minimize. In effect, the control block 134 configures the equalizer 110 to approximate the inverse frequency response of the SMPS 113. This can be achieved in any suitable way. As discussed above, the frequency response is determined and corrected only in respect of a bandwidth of interest.

Delay element 107 delays the signal by an amount that results in equal delay between the envelope signal reaching the power amplifier 109 through the power supply 113, and the radio frequency signal entering the power amplifier 109 via the modulator 108, preventing unwanted distortion caused by a time difference between envelope and radio frequency signals.

The polar transmitter 130 is provided as part of a transmitter device 140, which may be a battery-powered portable communications device. The device 140 may be a mobile phone, PDA, modem device or the like.

Figure 7:
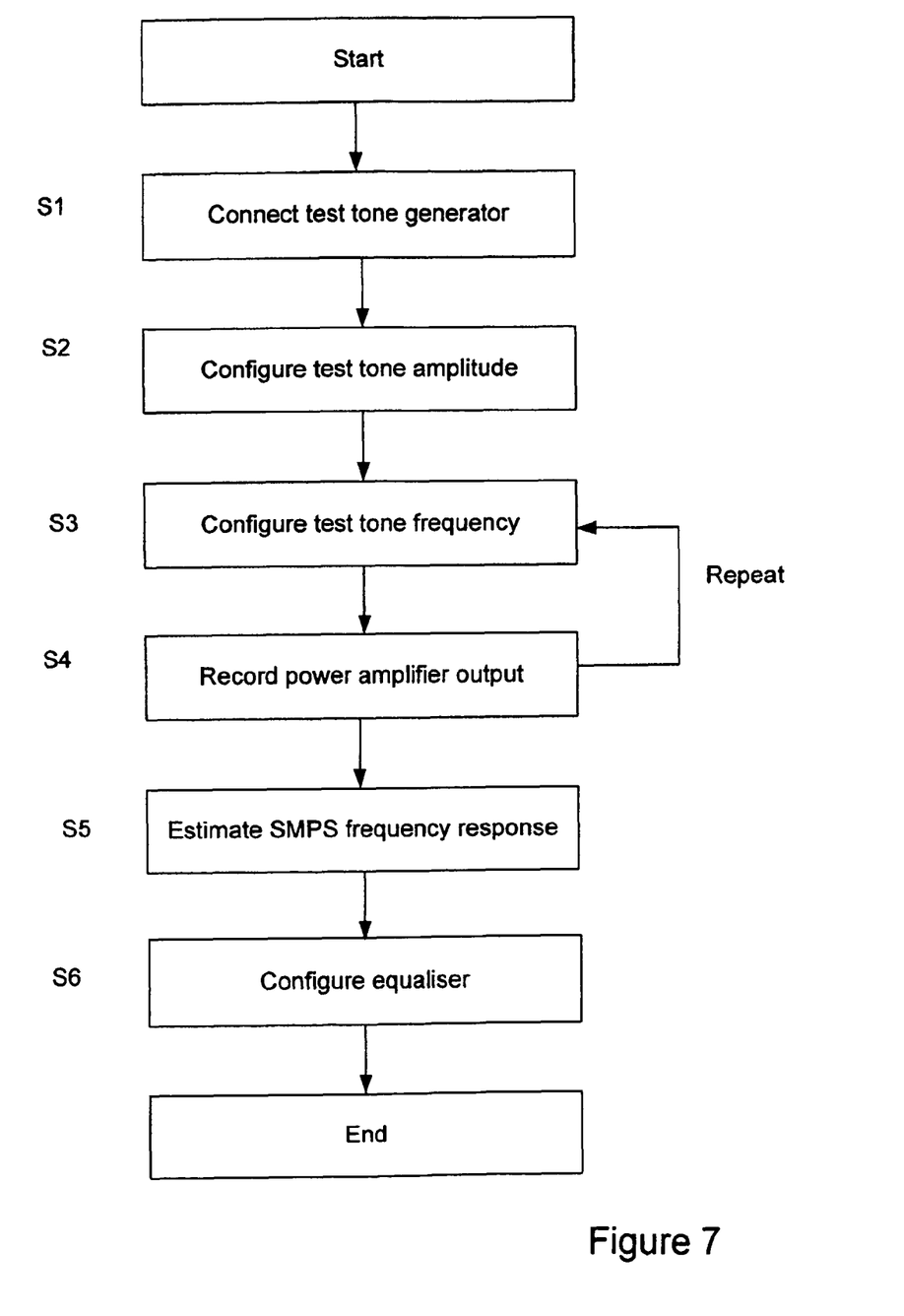
FIG. 7 is a flow chart showing a method of operation of the FIG. 6 transmitter in accordance with aspects of the present invention.

The method of operation of the FIG. 6, circuit will now be described briefly with reference to FIG. 7. Here, the test tone generator 132 is connected to the input of the Cartesian-to-polar converter 101 at step S1, after operation start. This commences a calibration process. At steps S2 and S3, the test tone generator 132 is configured to a predetermined frequency and amplitude respectively. The test tone generator 132 generates a two-tone signal that is symmetric around 0 Hz at baseband, for example I=$\alpha$ cos (2 $\pi$ft) and Q=0. The test tone is provided at the predetermined frequency at step S3.

The power of the transmitter output signal 115 is measured using the power sensor 133 and input to control block 134 at step S4. Based on the power measurement, the control block 134 estimates the supply voltage supplied by the SMPS 113, based on the signal provided by the power amplifier 109. The test tone generator 132 is then configured to a second frequency at step S3, and step S4 is repeated at the second frequency. Steps S3 and S4 repeat several times, spread across the frequency range over which the polar transmitter 130 is required to operate.

At step S5, the control block 117 estimates the frequency response of the SMPS 113. This involves comparison of the signal output by the SMPS 113 to the signal at the output 105 of the predistortion block 104. The control block 134 configures the equalizer 110 to approximate the inverse of the estimated frequency response.

At step S6 the equalizer 110 is configured/calibrated. Once the equalizer 110 is calibrated, the switch 131 is configured to pass through the communications signal 100 instead of the signal provided by test tone generator 132, and the polar transmitter 130 then is ready for normal transmission. The operation then ends.

The method of operation of the FIG. 6, circuit will now be described in more detail with reference to FIG. 7.

Briefly, the frequency response of the power amplifier 109 is estimated by applying to the radio frequency input a continuous-wave signal having a magnitude sufficient to drive the power amplifier 109 into saturation at mid-range supply voltage levels and by applying a second test signal to the input controlling the variable voltage source. The second test signal may consist of a constant term $a_{in}$ and a time-varying term $b_{in}$. For a typical Gallium Arsenide power amplifier, $a_{in}$ and $b_{in}$ may be chosen as for example $a_{in}(t)=3$ V/$G_n$, and $b_{in}(t)=1$ V sin(2 pi $f_{test}$ t)/$G_n$, where $f_{test}$ is a variable test tone frequency. Generally speaking, the magnitudes of signal terms $a_{in}$ and $b_{in}$ are chosen so that the resulting output voltage covers a sufficiently large region of the power amplifier's $V_{out}$-vs-$V_{cc}$-characteristics, where a variation in $V_{cc}$ causes approximately a linear variation in $V_{out}$.

Figure 8:
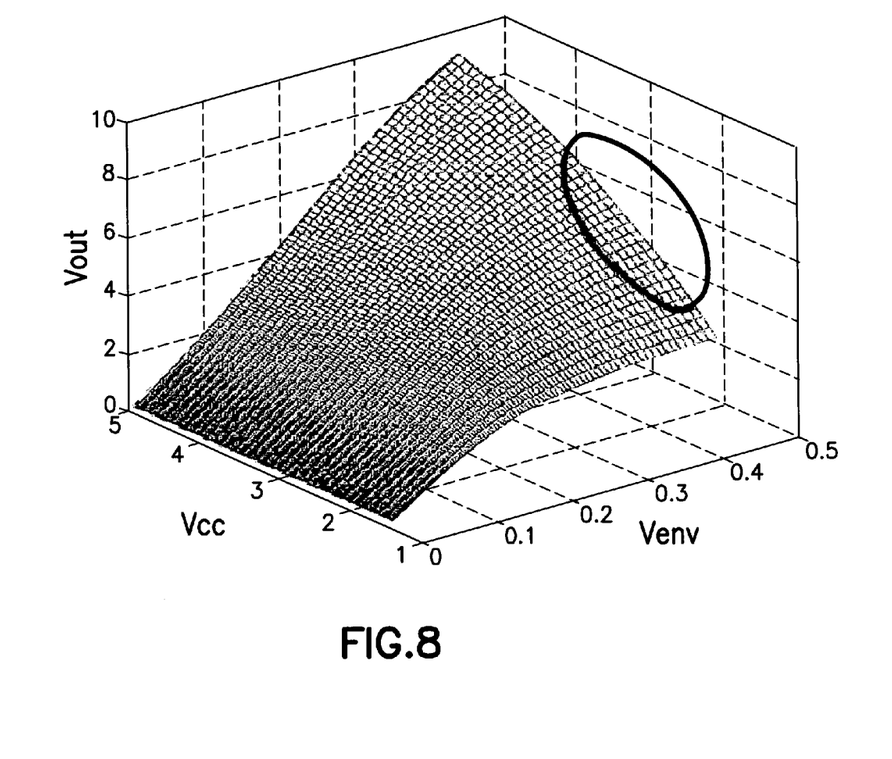
FIG. 8 shows the distortion characteristics of a power amplifier forming part of the FIG. 6 transmitter.

FIG. 8 shows the distortion characteristics of a typical GaAs power amplifier, of the kind often used in mobile wireless radio transmitters. The power amplifier 109 may be a power amplifier of this type. $V_{cc}$ denotes the supply voltage in Volts, provided to the power amplifier by a variable voltage supply. $V_{env}$ in Volts is the magnitude of a sine wave at the radio frequency input, and $V_{out}$ (Volts) is the magnitude of the resulting sine wave at the amplifier output.

When operating at the maximum value of $V_{env}$ shown in FIG. 8, the power amplifier 109 is driven into saturation. It acts essentially as a switch, and the magnitude of the output signal tends to be proportional to the magnitude of the supply voltage $V_{cc}$. For a linear power amplifier, operating in saturation is typically undesirable because the switching operation causes an intolerably high amount of distortion products and harmonics. However, the almost linear relationship between input and output signal magnitude when driving the power amplifier 109 into saturation (marked in FIG. 8) allows determination of the magnitude of the supply voltage from the magnitude of the output signal and the known distortion characteristics of the power amplifier. Therefore, saturated operation of the power amplifier can be utilized to measure the frequency dependent gain of the variable voltage source supplying the power amplifier 109.

The gain of the variable voltage source as a function of frequency is not known prior to performing the method, so it is not possible at this time to accurately predict the resulting output voltage of the variable voltage source to a given input signal. However, at least a nominal gain $G_n$ of the variable voltage source is known.

The output signal of the variable voltage source as a result of applying term $a_{in}$ to its input is $a_{out}=3$V G(0)/$G_n$, where G(0) is the actual gain of the variable voltage source at 0 Hz. Similarly, the output signal resulting from the input signal $b_{in}$ is $b_{out}=1$ V sin(2 pi $f_{test}$ t+$\phi$) G($f_{test}$)/$G_n$, where $\phi$ is a phase shift resulting from a delay between input and output signal.

Since $V_{out}$ depends approximately linearly on $V_{cc}$, the time-varying waveform at the supply voltage input modulates the continuous-wave signal provided to the radio frequency input. In particular, the sum of terms $a_{out}$ and $b_{out}$ modulating a continuous wave signal results in an amplitude-modulated signal. The magnitude of $a_{out}$ results in a spectral component at the frequency of the continuous-wave signal, and the magnitude of $b_{out}$ results in a lower and an upper sideband at frequency offsets $-f_{test}$ and $f_{test}$, respectively.

As long as the system is sufficiently linear, the superposition principle is applicable. Therefore, it may be assumed that the power of the modulation product resulting from $a_{out}$ is proportional only to the power of $a_{out}$, but independent of the power in $b_{out}$. Similarly, the power of the modulation product resulting from $b_{out}$ is proportional to the power in $b_{out}$, but independent of the power in $a_{out}$.

The total power at the output of the power amplifier may be measured in any suitable way, for example by downconverting the signal using a receiver, or by using a power detector. Power measurement may be gated so that it averages the power over a time interval that corresponds to a full number of periods of the test signal frequency $f_{test}$.

The procedure to estimate the unknown, frequency-dependent gain of the power supply 113 can then be summarized as follows: Firstly, at steps S2 and S3, a continuous wave signal is applied to the RF input of the power amplifier 109 with predetermined magnitude $V_{env}$, and a constant term $a_{in}$ is applied to the input of the power supply 113. At step S4, the power $P_1$ at the output of the power amplifier 109 is measured. Here (or later at step S5), from $P_1$ and the known impedance level, the equivalent magnitude ($V_{out}$) at the output of the power amplifier 109 is calculated. Next, the $V_{cc}$ that corresponds to the values of $V_{out}$ and $V_{env}$ is obtained from the known characteristics of the power amplifier 109 (FIG. 8). It also involves determining the gain of the variable voltage source at 0 Hz from the known magnitude of term $a_{in}$ and $V_{cc}$.

The procedure then is repeated for a first test tone frequency. At steps S2 and S3, a constant term $a_{in}$ plus time-varying term $b_{in}$ at first test tone frequency $f_{test,1}$ is configured then applied. The power $P_2$ at the output of the power amplifier 109 is then measured. Here (or later at step S5), the equivalent magnitude ($V_{out}$) at the output of the power amplifier 109 that corresponds to the power $P_2$-$P_1$ is calculated. Also at this time, the $V_{cc}$ that corresponds to the relevant values of $V_{out}$ and $V_{env}$ is determined from the known characteristics of the power amplifier 109, and the gain of the variable voltage source at frequency $f_{test,1}$ is determined from the known magnitude of term $b_{in}$ and $V_{cc}$.

This procedure is then repeated with additional test frequencies from $f_{test,2}$ to $f_{test,n}$. Every repetition results in an additional point of the estimated variable voltage source frequency response. The combined results obtained at step S5 provide an estimate of the overall frequency response of the power supply 113. Once the estimated frequency response is obtained, coefficients for applying to the equalizer 110 may be determined in any suitable way, for example using standard filter design techniques. The equalizer is then configured accordingly at step S6.

The effect of this is to compensate for variations in the response of the SMPS 113 at different frequencies. This is advantageous since it provides suitably high performance levels from a polar transmitter architecture when high bandwidth input signals are desired to be transmitted. In prior art polar transmitters, the design of the SMPS was required to accommodate the requirement for high bandwidth input signals, for instance by providing the SMPS with a flat frequency response. Polar transmitters have the advantage of high efficiency, compared to other transmitter types. As such, the fact that the embodied apparatus allows a power supply, for instance an SMPS, not having a flat frequency response to be used in polar transmitter arrangements is very significant.

In summary, the polar transmitter 130 uses two-tone (amplitude modulated) test signals of predetermined magnitude and frequency, observes the output signal of the power amplifier using a power detector, estimates the output signal of the SMPS, compares the estimated output signal to the known SMPS input signal, and repeats this for several test tone frequencies, thereby estimating the frequency response of the SMPS 113. It then configures a correction filter (the equalizer 110) to approximate the inverse frequency response, therefore linearizing the frequency response of the amplitude path. This embodiment can be described as a power sensor based implementation. The frequency response is determined and corrected only in respect of a bandwidth of interest.

An advantage achieved by the equalization of the frequency response of the power amplifier 109 is that the actual supply voltage provided to the power amplifier 109 can be predicted more accurately by the predistortion block 104.

The embodiment described above is of particular application to radio systems having a variable power envelope. As is well known, such systems allow higher spectral efficiency than do radio systems operating on fixed envelope signals.

The FIG. 6 embodiment is of lower complexity than the FIG. 4 embodiment, but has the disadvantage that it requires generation of a test tone. The FIG. 6 embodiment is particularly well suited for factory calibration.

A variation of either of the FIGS. 4 and 6 embodiments 112, 130, will now be described. Here, separate sets of equalizer coefficients are used depending on the known bandwidth of the signal, in particular the number of resource blocks.

Given a fixed length of the equalizer 110 (i.e. given a known number of coefficients and nominal delay), this allows tighter amplitude tracking in the narrowband case, since any unused bandwidth is a "don't care" area for the equalizer. This may achieve marginally better efficiency in some circumstances, for example in voice calls. Features of the polar transmitters described above can allow satisfactory operation with bandwidths of several MHz. Previously, polar transmitters were able to be used only with narrow bandwidth signals, for instance in GSM/EDGE systems, whilst achieving comparable performance.

These polar transmitters are provided as part of a transmitter device, which may be a battery-powered portable communications device. The device may be a mobile phone, PDA, modem device or the like.

In another embodiment (not shown) an envelope tracking transmitter (such as that shown in FIG. 1) is used with a power sensor based sensing and feedback mechanism (such as that shown in FIG. 6).

The above descriptions refer to providing a supply voltage to the power amplifier, and it will be appreciated that this is because such is the standard with current technology. However, it will also be understood that this is purely illustrative, and that the invention is applicable also to other power provision schemes known and unknown, including schemes that provide power as current, radio frequency energy, by laser or optical pumping (e.g. optical amplifier).

It should be realized that the foregoing examples should not be construed as limiting. Other variations and modifications will be apparent to persons skilled in the art upon reading the present application. Such variations and modifications extend to features already known in the field, which are suitable for replacing the features described herein, and all functionally equivalent features thereof. Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. Apparatus comprising:
an equalizer having a signal input, a control input and an output;
a controllable power supply having a control input and an output, the input of the controllable power supply being coupled to the output of the equalizer;
a power amplifier having a main signal input, a power supply input, and an output, the power supply input being coupled to the output of the controllable power supply; and
a controller having first and second inputs and an output, the first input being coupled directly or indirectly to the output of the controllable power supply, the second input being coupled to a node upstream of the equalizer, and the output being coupled to the control input of the equalizer;
the equalizer being configured to apply equalisation to an envelope signal received at its input and to provide a resulting equalized envelope signal at its output,
the controllable power supply being configured to provide a power signal at its output based on the equalized envelope signal received at its input,
the power amplifier being configured to utilize power received at its power supply input to provide on its output a modulated transmission signal representative of a signal received at the main signal input, and
the controller being configured to compare input signals received at its first input to signals received at its second input, and to utilize the results of the comparison to configure the equalizer to correct for variations in the response of the controllable power supply at different frequencies.

2. Apparatus as claimed in claim 1, wherein the control input of the controllable power supply is coupled to the output of the equalizer via a digital to analogue converter (DAC).

3. Apparatus as claimed in claim 1, comprising a source of envelope signals having an input connected to receive an input signal and an output coupled to the signal input of the equalizer.

4. Apparatus as claimed in claim 3, wherein the second input of the controller is coupled to the output of the source of envelope signals.

5. Apparatus as claimed in claim 3, wherein the source of envelope signals comprises a Cartesian-to-polar converter having amplitude and phase outputs, and the amplitude output of the Cartesian-to-polar converter is coupled to the signal input of the equalizer.

6. Apparatus as claimed in claim 3, wherein the source of envelope signals comprises an envelope detector.

7. Apparatus as claimed in claim 3, wherein the source of envelope signals comprises an envelope detector in series with a filter.

8. Apparatus as claimed in claim 3, wherein the source of envelope signals comprises an envelope detector in series with a non-linear filter.

9. Apparatus as claimed in claim 3, wherein the second input of the controller is coupled to the output of the source of envelope signals.

10. Apparatus as claimed in claim 1, comprising a predistortion arrangement arranged to receive the input signal at a first input and to receive the envelope signal at a second input and to provide therefrom a predistorted signal on an output, the output of the predistortion arrangement being coupled to the main signal input of the power amplifier.

11. Apparatus as claimed in claim 1, comprising a delay element connected upstream of the main signal input of the power amplifier.

12. Apparatus as claimed in claim 1, comprising a modulator connected upstream of the main signal input of the power amplifier.

13. Apparatus as claimed in claim 12, wherein the modulator is a phase modulator.

14. Apparatus as claimed in claim 12, wherein the modulator is a linear modulator.

15. Apparatus as claimed in claim 1, wherein the first input of the controller is coupled to the output of the controllable power supply via an analogue to digital converter (ADC).

16. Apparatus as claimed in claim 1, wherein the first input of the controller is coupled to the output of the power amplifier.

17. Apparatus as claimed in claim 1, wherein the first input of the controller is coupled to the output of the power amplifier via a power sensor.

18. Apparatus as claimed in claim 1, wherein the first input of the controller is coupled to the output of the controllable power supply via a power sensor.

19. Apparatus as claimed in claim 1, wherein the equalizer is a digital filter.

20. Apparatus as claimed in claim 1, wherein the equalizer is a finite impulse response filter.

21. Apparatus as claimed in claim 1, comprising a test tone generator having an output coupled to the signal input of the equalizer, the test tone generator being configured to generate signals at different frequencies at different times and to provide them to the signal input of the equalizer.

22. Apparatus as claimed in claim 1, wherein the controller is configured to configure the equalizer to correct for variations in the response of the controllable power supply at different frequencies by being configured to approximate the inverse frequency response of the controllable power supply across a range of frequencies of interest.

23. Apparatus comprising:
  equalizer means having a signal input, a control input and an output;
  controllable power supply means having a control input and an output, the input of the controllable power supply means being coupled to the output of the equalizer means;
  power amplifier means having a main signal input, a power supply input, and an output, the power supply input being coupled to the output of the controllable power supply means; and
  control means having first and second inputs and an output, the first input being coupled directly or indirectly to the output of the controllable power supply means, the second input being coupled to a node upstream of the equalizer means, and the output being coupled to the control input of the equalizer means;
  the equalizer means being configured to apply equalisation to an envelope signal received at its input and to provide a resulting equalized envelope signal at its output,
  the controllable power supply means being configured to provide a power signal at its output based on the equalized envelope signal received at its input,
  the power amplifier means being configured to utilize power received at its power supply input to provide on its output a modulated transmission signal representative of a signal received at the main signal input, and
  the control means being configured to compare input signals received at its first input to signals received at its second input, and to utilize the results of the comparison to configure the equalizer means to correct for variations in the response of the controllable power supply at different frequencies.

24. Apparatus as claimed in claim 1, forming part of a battery-powered communications device.

25. A method comprising:
  generating an envelope signal from an input signal;
  using an equalizer to filter the envelope signal;
  using the filtered envelope signal to control a controllable power supply to provide power to a power amplifier;
  comparing an output of the controllable power supply to signals at a node upstream of the equalizer, wherein the comparing comprises sensing power at an output of the power amplifier; and
  configuring the equalizer to correct for variations in the response of the controllable power supply at different frequencies.

26. A method as claimed in claim 25, comprising using an input signal and the envelope signal to provide a predistorted signal, and providing the predistorted signal to a main signal input of the power amplifier.

27. A method as claimed in claim 25, comprising using a delay element to delay signals provided to a main signal input of the power amplifier.

28. A method as claimed in claim 25, wherein comparing the output of the controllable power supply to signals at a node upstream of the equalizer further comprises sensing signals at an output of the controllable power supply.

29. A method as claimed in claim 25, comprising generating signals at different frequencies at different times and providing said generated signals to a signal input of the equalizer.

30. Apparatus as claimed in claim 23, wherein the control means is configured to configure the equalizer means to correct for variations in the response of the controllable power supply means at different frequencies by being configured to approximate the inverse frequency response of the controllable power supply means across a range of frequencies of interest.

* * * * *